(12) United States Patent
Hsu

(10) Patent No.: US 10,211,557 B2
(45) Date of Patent: Feb. 19, 2019

(54) CONNECTOR ASSEMBLY

(71) Applicant: FOXCONN INTERCONNECT TECHNOLOGY LIMITED, Grand Cayman (KY)

(72) Inventor: Shuo-Hsiu Hsu, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/921,671

(22) Filed: Mar. 15, 2018

(65) Prior Publication Data

US 2018/0269610 A1 Sep. 20, 2018

(30) Foreign Application Priority Data

Mar. 15, 2017 (CN) .......................... 2017 1 0153083

(51) Int. Cl.
| | |
|---|---|
| *H04B 1/40* | (2015.01) |
| *H01R 12/79* | (2011.01) |
| *H05K 1/18* | (2006.01) |
| *H05K 1/02* | (2006.01) |

(52) U.S. Cl.
CPC .............. *H01R 12/79* (2013.01); *H04B 1/40* (2013.01); *H05K 1/028* (2013.01); *H05K 1/0243* (2013.01); *H05K 1/181* (2013.01); *H05K 2201/10189* (2013.01); *H05K 2201/10371* (2013.01); *H05K 2201/2009* (2013.01); *H05K 2201/2018* (2013.01)

(58) Field of Classification Search
CPC .......... H04B 1/40; H01R 12/73; H01R 12/78; H01R 12/79; H01R 12/87; H01R 13/6582; H01R 13/665
USPC ......... 455/90.3, 575.1; 439/67, 77, 345, 346
See application file for complete search history.

(56) References Cited

U.S. PATENT DOCUMENTS

| | | | | |
|---|---|---|---|---|
| 6,017,222 A * | 1/2000 | Kao | ..................... | H01R 12/613 439/67 |
| 6,338,631 B1 * | 1/2002 | Hashimoto | .......... | H01R 12/727 439/67 |
| 7,361,048 B2 * | 4/2008 | Shimada | ................ | H01R 12/79 439/492 |
| 9,032,130 B2 * | 5/2015 | Aldana | ................ | H04B 10/801 710/303 |
| 9,461,384 B2 * | 10/2016 | Park | ..................... | H01R 12/714 |

\* cited by examiner

*Primary Examiner* — Quochien B Vuong
(74) *Attorney, Agent, or Firm* — Wei Te Chung; Ming Chieh Chang

(57) ABSTRACT

A connector assembly having two ends respectively connected to a case and a main circuit board comprises a bracket, a bottom plate assembled on the bottom of the bracket and a flexible circuit board located between the bracket and the bottom plate. The bracket includes a mating surface attached to the case, a mounting surface opposite the mating surface, and a receiving cavity recessed inwardly from the mounting surface. The bracket includes a pair of openings extending through the mating surface thereof and communicating with the receiving cavity. A pair of chip modules are disposed on the flexible circuit board corresponding to the openings. One side of the flexible circuit board, which is farther away from the bracket, includes an electrical connector for mating with the main circuit board.

20 Claims, 6 Drawing Sheets

CONNECTOR ASSEMBLY

BACKGROUND OF THE INVENTION

1. Field of the Invention

The present invention relates generally to a connector assembly, more particularly to a connector assembly can be used independently.

2. Description of Related Arts

The existing high-frequency microwave chip can be used for transmitting high-speed data at the time of docking. The application of the chip needs to match passive components and the layout of the circuit board. The chip needs to be in close contact with the device while be used. However, when the chip is mounted on the main circuit board, it will limit the position of its placement and the design of the internal mechanism. At the same time, the layout of the circuit board needs to meet the demand of high-frequency transmission. The cost will be greatly increased if the chip is installed on the main circuit board. And when the circuit board line coexists with other components on the main circuit board, it will also increase the difficulty of its design.

Hence, a new connector assembly is desired to improve those disclosed in the aforementioned proposal.

SUMMARY OF THE INVENTION

Accordingly, the object of the present invention is to provide a connector assembly with a flexible circuit board, which can realize the connection between the two devices through a flexible circuit board.

To fulfill the above-mentioned object, a connector assembly having two ends respectively connected to a case and a main circuit board comprises a bracket, a bottom plate assembled on the bottom of the bracket and a flexible circuit board remained in the receiving cavity of the bracket. The bracket includes a mating surface attached to the case, a mounting surface opposite the mating surface, and a receiving cavity recessed inwardly from the mounting surface. The flexible circuit board located between the bracket and the bottom plate. The bracket includes a pair of openings extending through the mating surface thereof and communicating with the receiving cavity. A pair of chip modules are disposed on the flexible circuit board corresponding to the openings. One side of the flexible circuit board which is further away from the bracket includes an electrical connector for mating with the main circuit board. The invention integrates the chip module into the flexible circuit board, which improves the space utilization ratio of the main circuit board and saves the cost. Meanwhile, the connector assembly is independent, which is favorable for improving the flexibility of the device design.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
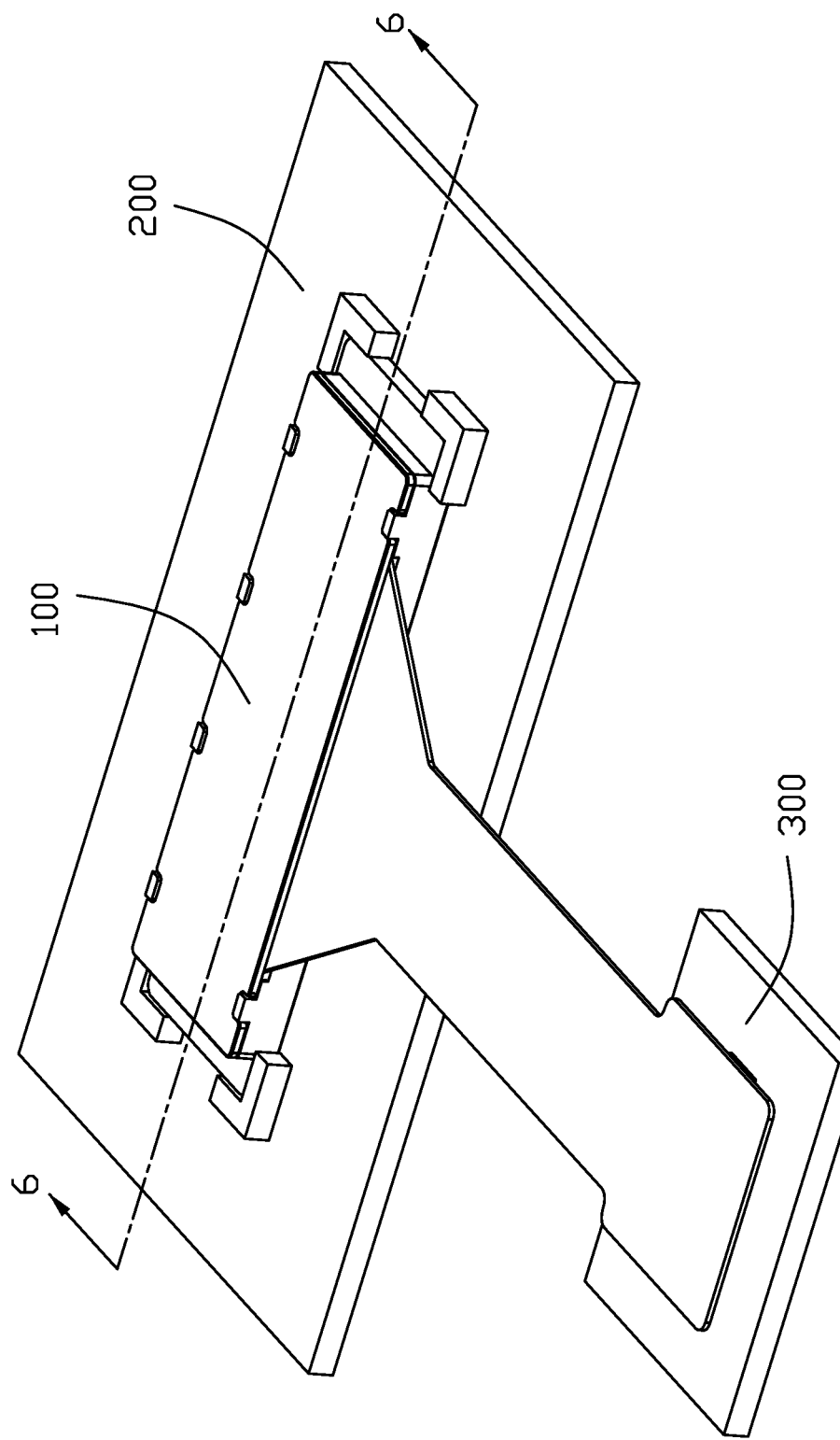
FIG. 1 is a top perspective view of a connector system.
Figure 2:
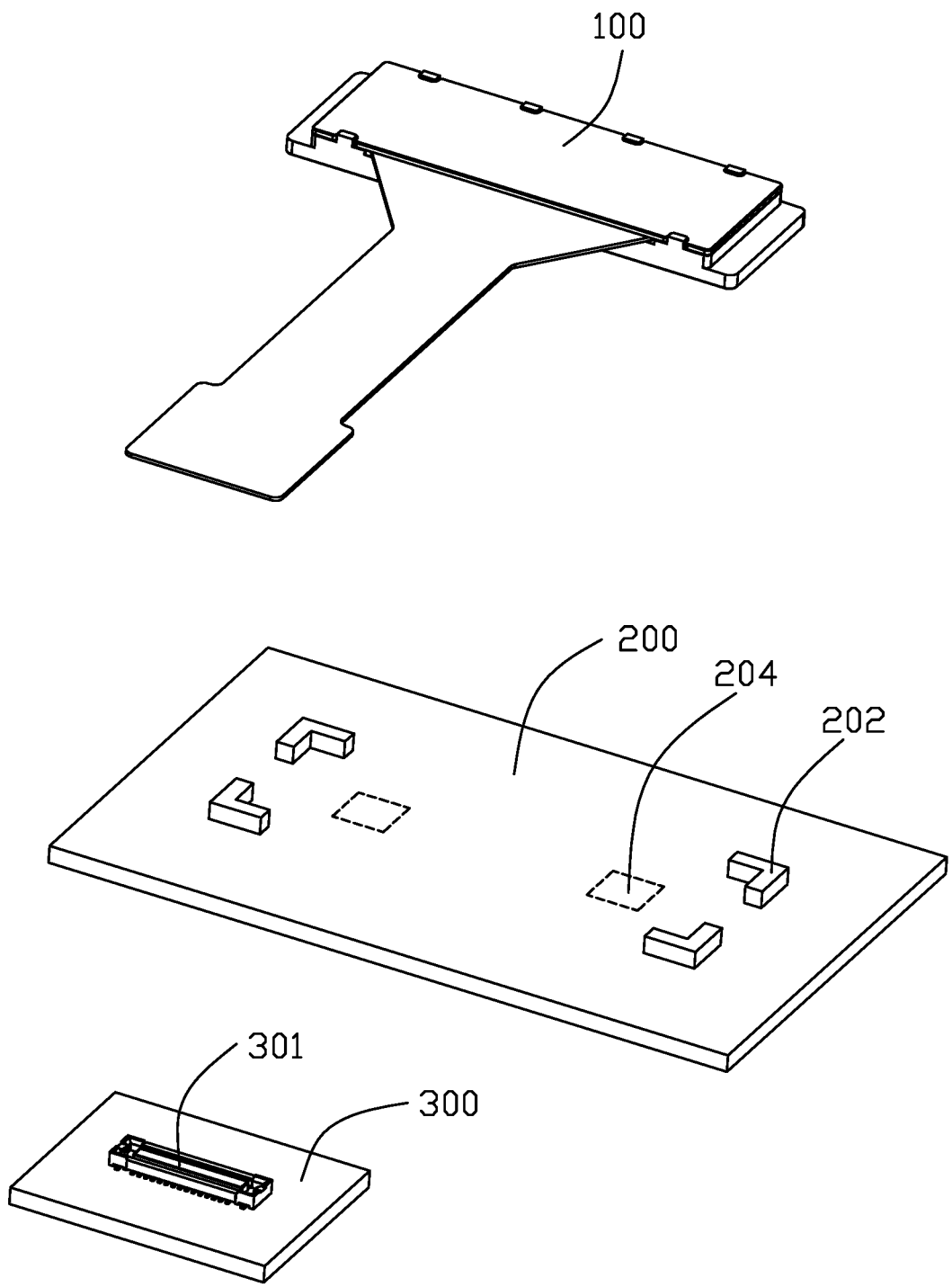
FIG. 2 is a top exploded perspective view of the connector system shown in FIG. 1 when a connector assembly is not docked.
Figure 3:
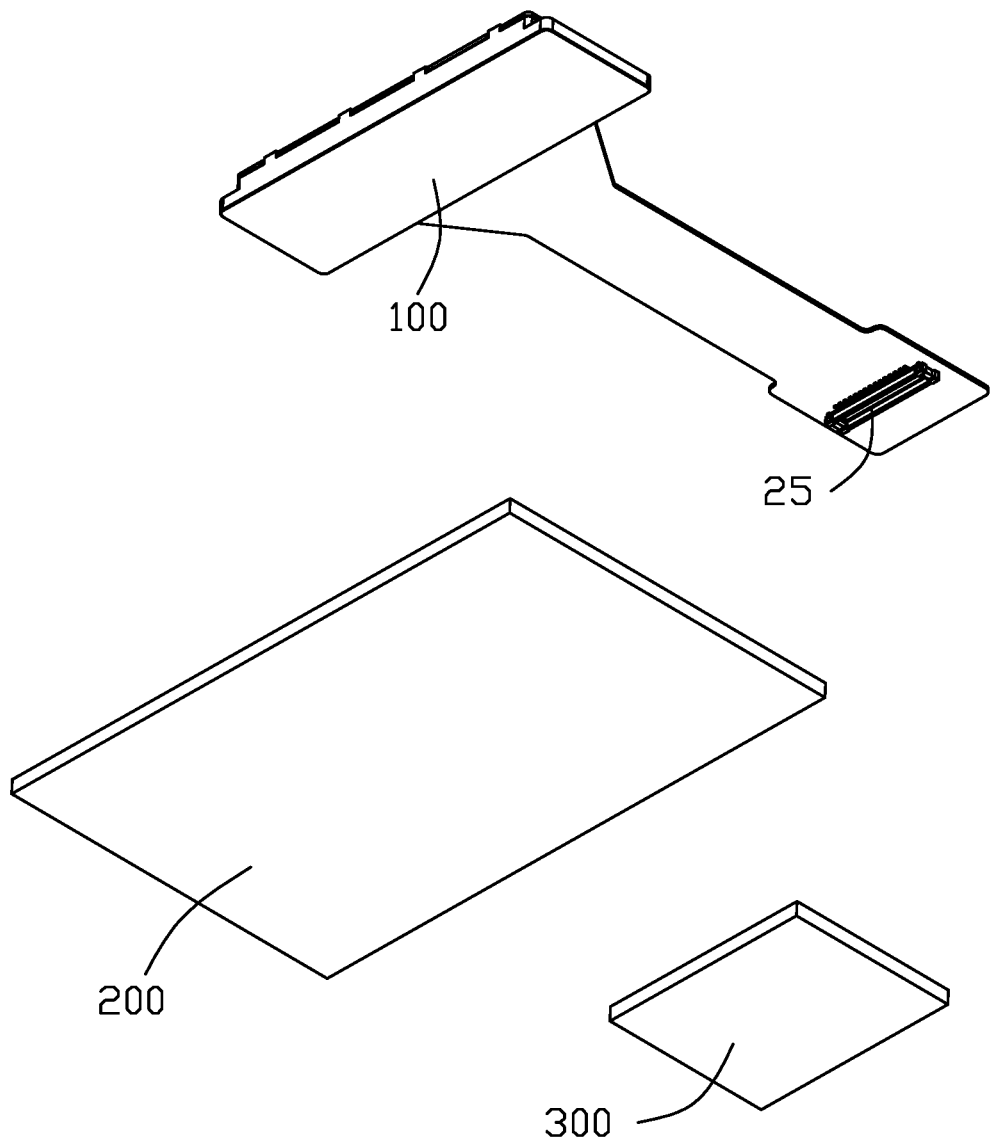
FIG. 3 is a bottom perspective view of the connector system shown in FIG. 2.

Referring to FIGS. 1-3, a connector system comprises a connector assembly 100, a case 200 and a main circuit board 300 provided with a first electrical connector 301. Two ends of the connector assembly 100 respectively connected to the main circuit board 300 and the case 200. The case 200 is a housing of an electronic equipment. The electronic equipment transmits the high-frequency signal by connecting with the connector assembly 100. The first electrical connector 301 is connected with the connector assembly 100 for realizing signal transfer between the case 200 and the main circuit board 300.

Figure 4:
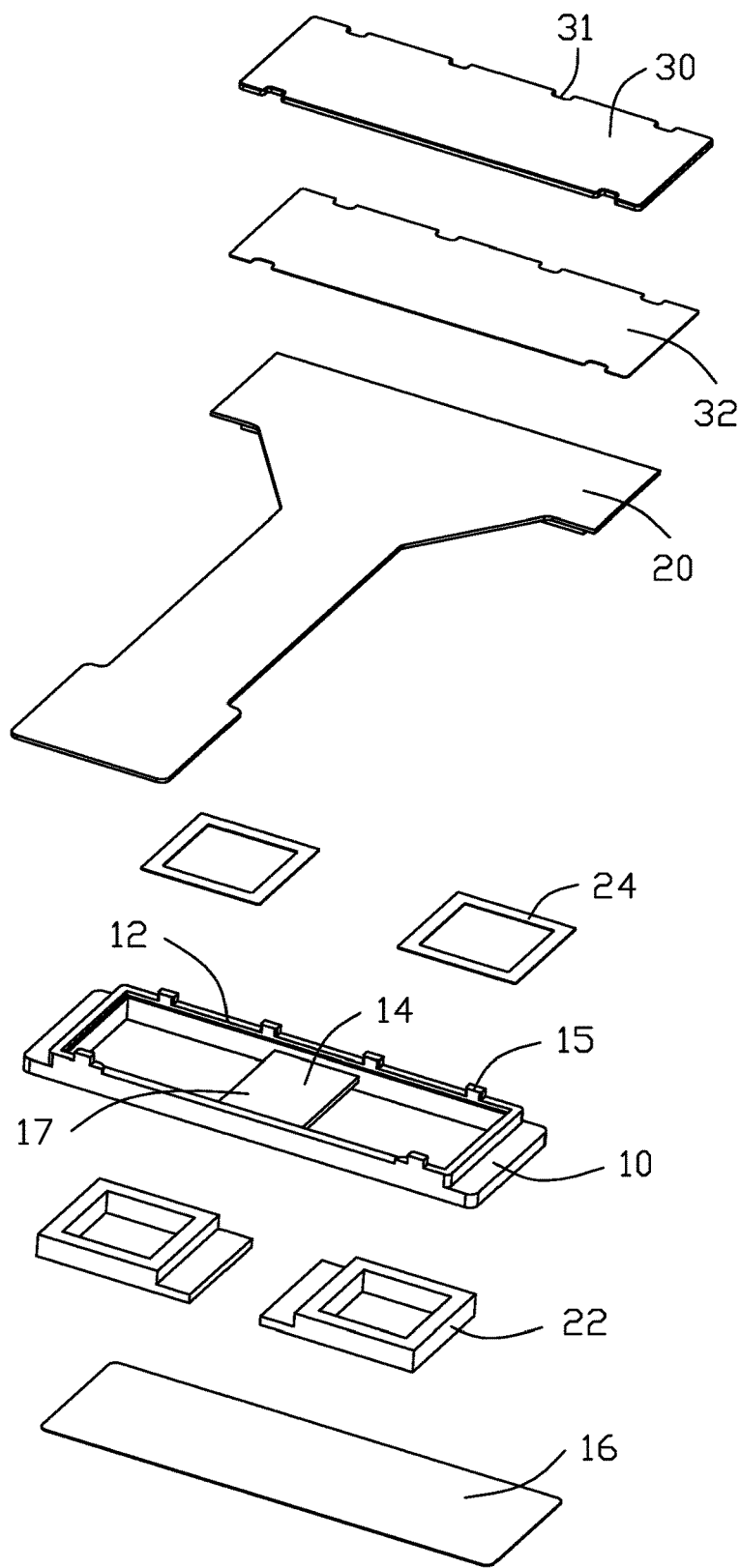
FIG. 4 is a top exploded perspective view of the connector assembly shown in FIG. 2.
Figure 5:
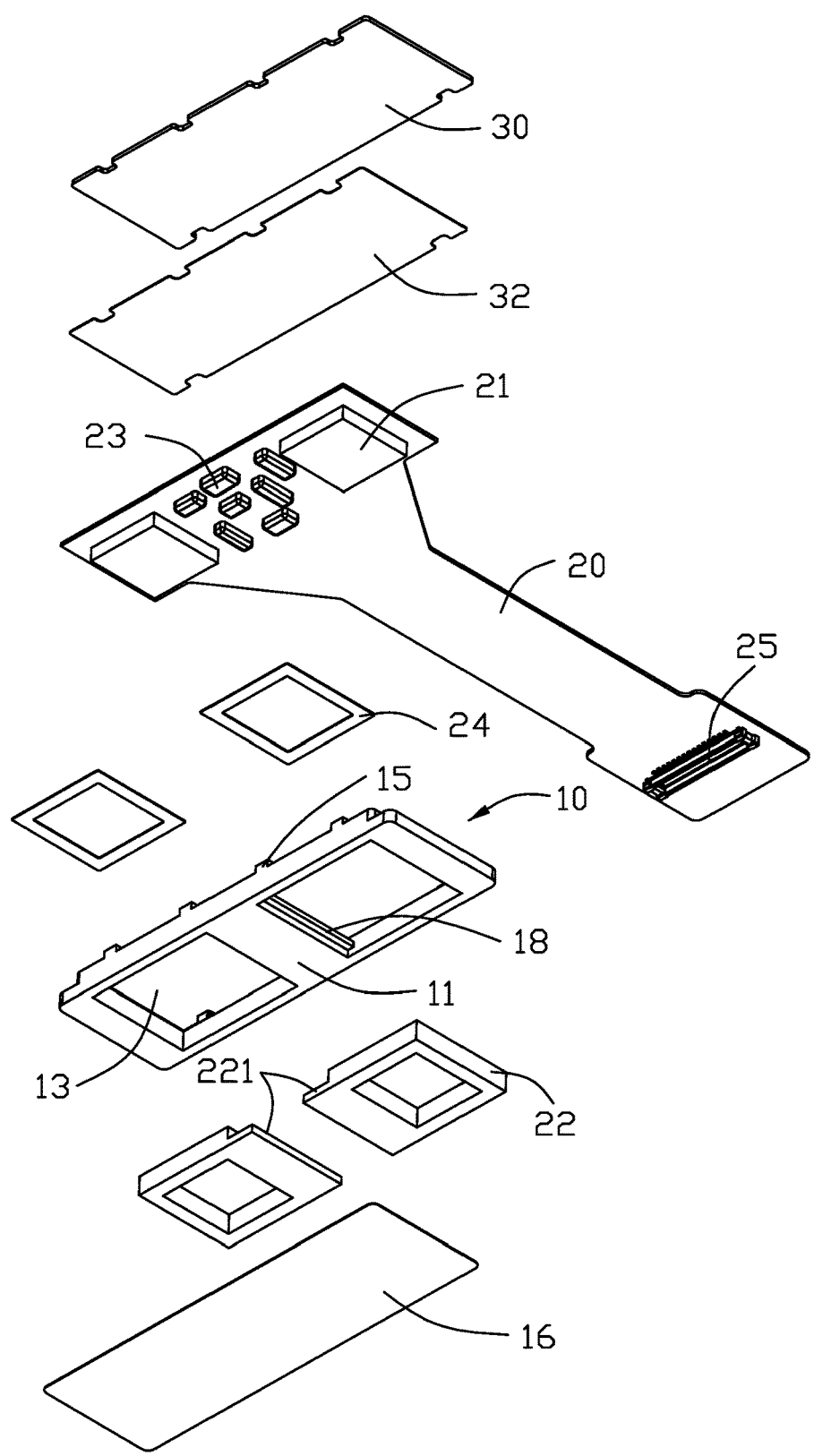
FIG. 5 is a bottom exploded perspective view of the connector assembly shown in FIG. 3.

Referring to FIGS. 4-5, the connector assembly 100 comprises a bracket 10, a reinforcement bottom plate 30 assembled on the bottom of the bracket 10 and a flexible circuit board 20 received in the bracket 10. The bracket 10 is made of plastic material and includes a mating surface 11 attached to the case 200, a mounting surface 12 opposite the mating surface 11, and a receiving cavity 14 recessed inwardly from the mounting surface 12. The bracket 10 includes a pair of openings 13 extending through the mating surface 12 thereof and communicating with the receiving cavity 14. The bottom plate 30 is made of metal material and is provided with a plurality of notches 31 located on its both longitudinal side. A plurality of embosses 15 protrude downward from the mounting surface 12 of the bracket 10. The embosses 15 are received in the corresponding notches 31. The embosses 15 and the notches 31 are form an interference fit, so that the bonding force between the bracket 10 and the bottom plate 30 is increased by riveting.

Figure 6:
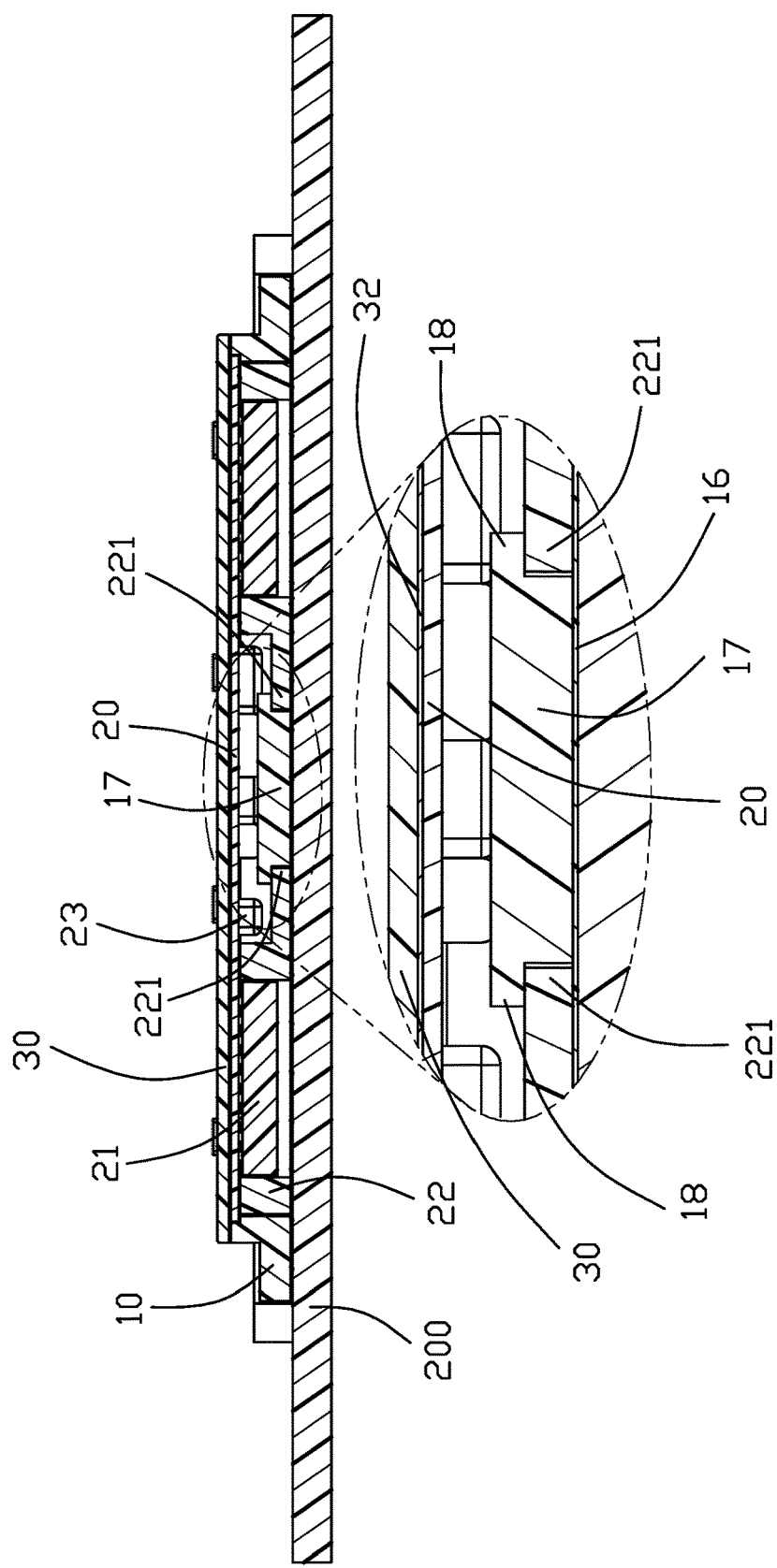
FIG. 6 is a cross-sectional view of the connector system of FIG. 1 along line 6-6 extending along a transverse direction.

The flexible circuit board 20 is located between the bracket 10 and the bottom plate 30 and remained in the receiving cavity 14 of the bracket 10. A pair of chip modules are disposed on the flexible circuit board 20 corresponding to the openings 13. The chip modules are remained in the bracket 10 and each includes a chip 21 and an absorber 22 surrounding the chip 21. As shown in FIG. 6, the chip 21 is received in the receiving cavity 14 of the bracket 10 and fixed on the flexible circuit board 20. The absorber 22 is assembled into the receiving cavity 14 through the opening 13 of the bracket 10. The flexible circuit board 20 is further provided with a plurality of passive components 23 located between the two chip modules and received in the receiving cavity 14.

The chip 21 is a high-frequency microwave chip and corresponds to the opening 13 of the bracket 10. The chip 21 is used for transmitting high-speed data at the time of docking. The chips 21 of the two chip modules are mounted on the flexible circuit board 20. The two chips 21 are respectively used as a transmitter chip for sending signals and a receiver chip for receiving signals. The absorber 22 is used to absorb the outwardly scattered clutter generated by the chips 21 when transmitting high-speed data. The absorber 22 is overlapping joint a partition 17 between two openings 12 of the bracket 10. The upper surface of the absorber 22 is flat with the mating surface 11 of the bracket 10. The mating surface 11 of the bracket 10 is provided with a concave assembly portion 18 corresponding to two side edges of the partition 17. The absorber 22 includes a projecting portion 221 extending toward the partition 17. The protruding portion 221 is retained in the assembly portion 18 to support the absorber 22 so as to prevent the absorber 22 from moving away from the case 20 in the vertical direction when the bracket 10 is attached upon the case 20. This engagement in the vertical direction avoiding the signal loss caused by forming a gap between the absorber 22 and the case 200 during mating.

The connector assembly 100 includes several adhesives. The mating surface 11 of the bracket 10 is provided with an adhesive 16 (such as double-sided adhesive, etc.), which can be directly adhered to the surface of the case 200 when used, so as to form a good transmission of high-frequency signal between the chips 21 and the electronic equipment. The bottom of the absorber 22 is provided with an adhesive 24 for adhering to the flexible circuit board 20. A side of the bottom plate 30 toward the flexible circuit board 20 is provided with an adhesive 32. The adhesive 32 is a conductive adhesive and has the same shape as the bottom plate 30. The flexible circuit board 20 is adhered to the bottom plate 30 by the adhesive 32. The flexible circuit board 20 is provided with a grounding path contacting with the adhesive for grounding the bottom plate 30 and having a heat dissipation function. The mounting surface 12 of the bracket 10 is also adhered to the bottom plate 30 by the adhesive 32. At the same time, the embosses 15 of the bracket 10 cooperates with the notches 31 of the bottom plate 30, which solves the problem that insufficient adhesion between the bracket 10 and the bottom plate 30 because the contact area may be too small.

When the connector assembly 100 is assembled, the first step is mounting the chip 21 and the passive component 23 on one side of the flexible circuit board 20, and mounting the electrical connector 25 on the other side of the flexible circuit board 20. The second step is adhered the flexible circuit board 20 of which the side having the chips 21 to the bottom plate 30. The third step is assembling the bracket 10 to the bottom plate 30, the side of the flexible circuit board 20 having the chips 21 is covered by the bottom plate 30. The fourth step is assembling the absorber 22 to the flexible circuit board 20 through the opening 13 of the bracket 10. Finally, adhered the adhesive 16 on the mating surface 11 of the bracket 10. When the connector assembly 100 is used, the bracket 10 is attached to the case 200 of the electronic equipment, the electrical connector 25 on the flexible circuit board 20 is mating with the first electrical connector 301 on the main circuit board 300 at same time, which can achieve the signal conversion between the case 200 of the electronic equipment and the main circuit board 300. The invention integrates the chip module into the flexible circuit board 20, which improves the space utilization ratio of the main circuit board 300 and saves the cost. Meanwhile, the connector assembly 100 is independent, which is favorable for improving the flexibility of the device design. Notably, the case 200 includes a plurality of blocks 202 to constrain horizontal movement of the bracket 10 relative to the case 200, and defines a pair of areas 204 to be coupled to and aligned with the chips 21 for wireless signal transmission. Understandably, the adhesive 16 may includes two openings in alignment with the corresponding areas 204.

Although the present invention has been described with reference to particular embodiments, it is not to be construed as being limited thereto. Various alterations and modifications can be made to the embodiments without in any way departing from the scope or spirit of the present invention as defined in the appended claims. The invention integrates the chip module into the flexible circuit board by removal from the main circuit board, thus improving the space utilization on the main circuit board and saving the cost. Meanwhile, the chip module is independent of the device, which is favorable for improving design flexibility of the device design.

What is claimed is:

1. A connector assembly having two ends respectively connected to a case and a main circuit board comprising:
a bracket including a mating surface attached to the case, a mounting surface opposite the mating surface, and a receiving cavity recessed inwardly from the mounting surface;
a bottom plate assembled on the bottom of the bracket; and
a flexible circuit board located between the bracket and the bottom plate and remained in the receiving cavity of the bracket;
wherein the bracket includes a pair of openings extending through the mating surface thereof and communicating with the receiving cavity, a pair of chip modules are disposed on the flexible circuit board corresponding to the openings, one side of the flexible circuit board which is further away from the bracket includes an electrical connector for mating with the main circuit board.

2. The connector assembly as claimed in claim 1, wherein the chip modules are remained in the bracket and each includes a chip and an absorber surrounding the chip.

3. The connector assembly as claimed in claim 2, wherein the absorber is assembled into the receiving cavity through the opening of the bracket.

4. The connector assembly as claimed in claim 2, wherein the chip is a high-frequency microwave chip and corresponds to the opening of the bracket, the chip is used for transmitting high-speed data.

5. The connector assembly as claimed in claim 2, wherein the absorber is overlapping joint a partition between two openings of the bracket, the upper surface of the absorber is flat with the mating surface of the bracket.

6. The connector assembly as claimed in claim 5, wherein the bottom of the absorber is provided with an adhesive for adhering to the flexible circuit board.

7. The connector assembly as claimed in claim 5, wherein the mating surface of the bracket is provided with a concave assembly portion corresponding to two side edges of the partition, the absorber includes a projecting portion extending toward the partition, the protruding portion is retained in the assembly portion to support the absorber.

8. The connector assembly as claimed in claim 1, wherein the bottom plate is provided with a plurality of notches located on its both longitudinal side, a plurality of embosses protrude downward from the mounting surface of the bracket, the embosses are received in the corresponding notches, the embosses and the notches are form an interference fit.

9. The connector assembly as claimed in claim 1, wherein a side of the bottom plate toward the flexible circuit board is provided with an adhesive, the adhesive is a conductive adhesive and has the same shape as the bottom plate.

10. The connector assembly as claimed in claim 9, wherein the flexible circuit board and the mounting surface of the bracket are adhered to the bottom plate by the adhesive.

11. The connector assembly as claimed in claim 10, wherein the flexible circuit board is adhered to the bottom plate by the adhesive, the flexible circuit board is provided with a grounding path contacting with the adhesive.

12. A connector system comprising:
- a main circuit board provided with a first electrical connector;
- a case of an electronic equipment; and
- a connector assembly for transmitting high-speed data comprising a bracket, a bottom plate and a flexible circuit board located between the bracket and the bottom plate;
- wherein the bracket includes a mating surface attached to the case, a mounting surface opposite the mating surface, and a receiving cavity recessed inwardly from the mounting surface, the bottom plate is assembled on the bottom of the bracket, the flexible circuit board is remained in the receiving cavity of the bracket;
- wherein two ends of the connector assembly respectively are connected to the main circuit board and the case, the bracket includes a pair of openings extending through the mating surface thereof and communicating with the receiving cavity, a pair of chip modules are disposed on the flexible circuit board corresponding to the openings, one side of the flexible circuit board which is further away from the bracket includes an electrical connector for mating with the first electrical connector.

13. The connector assembly as claimed in claim 12, wherein the chip modules are remained in the bracket and includes a chip and an absorber surrounding the chip, the absorber is assembled into the receiving cavity through the opening of the bracket.

14. An electrical connection assembly comprising:
- an electronic device having an external case on which a pair of wireless transmission areas are formed;
- an FPC (Flexible Printed Circuit) having opposite first and second regions thereof wherein the first region is adapted to be connected to the case and the second region is adapted to be connected to a main circuit board so as to achieve signal transmission between the electronic device and the main circuit board via said FPC instead of direct intimate wireless signal transmission between the electronic device and the main circuit board;
- a first chip functioning as a wireless transmitter and a second chip functioning as a wireless receiver mounted upon the first region in a vertical direction perpendicular to said first region; and
- a bracket attached upon the first region horizontally circumferentially enclosing the first chip and the second chip; wherein
- said bracket is intimately attached to the case to have the first chip and the second chip aligned with the pair of corresponding wireless transmission areas in the vertical direction.

15. The electrical connection assembly as claimed in claim 14, further including a pair of absorbers retained on the first region of the FPC, horizontally surrounding the corresponding first chip and second chip and protectively enclosed within the bracket.

16. The electrical connection system as claimed in claim 15, wherein an interengaging means is formed between the bracket and absorbers for preventing the absorbers from moving away from the case in the vertical direction when the bracket is attached to the case.

17. The electrical connection assembly as claimed in claim 14, further including a reinforcement bottom plate attached on a back side of the first region of said FPC opposite to the bracket so as to have the FPC sandwiched between the reinforcement bottom plate and the bracket.

18. The electrical connector assembly as claimed in claim 17, wherein said bracket is further directly secured to the bottom plate.

19. The electrical connection assembly as claimed in claim 14, wherein the case forms a restriction block set to restrain horizontal movement of the block relative to the case.

20. The electrical connection assembly as claimed in claim 14, wherein the first region of the FPC is retained and received in a space confined in a peripheral wall of the bracket without a risk of relative horizontal movement between the FPC and the bracket.

* * * * *